United States Patent
Chou

(10) Patent No.: US 7,414,552 B2
(45) Date of Patent: Aug. 19, 2008

(54) ANALOG FRONT END CIRCUIT FOR CONVERTING ANALOG SIGNAL OUTPUTTED BY IMAGE SENSOR INTO DIGITAL SIGNAL

(75) Inventor: Kuo-Yu Chou, HsinChu (TW)

(73) Assignee: Novatek Microelectronics Corp., Hsinchu (TW)

( * ) Notice: Subject to any disclaimer, the term of this patent is extended or adjusted under 35 U.S.C. 154(b) by 900 days.

(21) Appl. No.: 10/815,746

(22) Filed: Apr. 2, 2004

(65) Prior Publication Data

US 2005/0151677 A1 Jul. 14, 2005

(30) Foreign Application Priority Data

Jan. 8, 2004 (TW) .............................. 93100482 A

(51) Int. Cl.
*H03M 1/06* (2006.01)
(52) U.S. Cl. ...................................... 341/118; 341/155
(58) Field of Classification Search .......... 341/118–165
See application file for complete search history.

(56) References Cited

U.S. PATENT DOCUMENTS 6,753,801 B2 * 6/2004 Rossi ........................... 341/161
7,123,301 B1 * 10/2006 Nakamura et al. .......... 348/301

\* cited by examiner

*Primary Examiner*—Lam T Mai
(74) *Attorney, Agent, or Firm*—Jianq Chyun IP Office

(57) ABSTRACT

An analog front end circuit comprises a variable gain amplifier circuit (VGA circuit), a first sample switch, a second sample switch, a hold switch and an analog to digital converter device. The VGA circuit comprises a first input end, a second input end, and at least one output end. The first input end is used for receiving first voltage level signals. The second input end is used for receiving first reference signals. The output end is used for outputting at least one amplified signal. While the first sample switch is at a first conductive state, the first input end receives the first voltage level signal. While the second sample switch is at the first conductive state, the second input end receives the first reference signal. Finally, while the hold switch is at a second conductive state, the output end outputs the amplified signal.

20 Claims, 7 Drawing Sheets

ANALOG FRONT END CIRCUIT FOR CONVERTING ANALOG SIGNAL OUTPUTTED BY IMAGE SENSOR INTO DIGITAL SIGNAL

BACKGROUND OF THE INVENTION

1. Field of the Invention

The present invention relates to an analog front end circuit and the method thereof, especially when an analog front end circuit is processed in the manner of sampling twice and the method thereof.

2. Description of the Prior Art

The analog front end circuit (AFE circuit) is quite an important element in an image capture device (e.g. digital still camera and digital video camera). The analog front end circuit is mainly used for receiving the output signals of the image sensor and converting the pixel signals to digital signals for subsequent elements to process.

The output signal of the image sensor (e.g. Charged-Coupled devices, CCD) is converted to digital signal via signal modulation and analog-to-digital converter (ADC) for subsequent processing. Please refer to FIG. 1. FIG. 1 is a schematic diagram of an image capture device of the prior art. The image capture device 2 of the prior art utilizes an optical system 4 to capture the optical image and performs signal processing via a CCD sensor 6, an AFE circuit 8, and a digital processor 9 subsequently.

The function of the AFE circuit 8 is to convert the CCD signal 10 outputted by the CCD sensor 6 to a digital signal 7 via ADC and output the digital signal 7 to the digital processor 9.

Please refer to FIG. 1 and FIG. 2. FIG. 2 is a schematic diagram of a sample and hold circuit 20 of the AFE circuit 8 of the prior art. The sample and hold circuit 20 of the AFE circuit 8 of the prior art comprises an operational amplifier 22, a set of capacitors 24, 26, a sample switch 28, and a hold switch 30. The sample and hold circuit 20 is used for sampling and holding the CCD signal 10 and outputting an output signal 42, wherein the sample switch 28 is controlled by a sample pulse signal (not shown in FIG. 2), and the hold switch 30 is controlled by a hold pulse signal (not shown in FIG. 2).

Please refer to FIG. 3. FIG. 3 is a time sequence diagram of the CCD signal 10, the sample pulse signal 32, and the hold pulse signal 34 of the prior art. In the time sequence diagram of FIG. 3, the horizontal axis represents time, and the vertical axis represents amplitude of signal. The CCD signal 10 is a periodic analog signal with period of T. The CCD signal 10 of each cycle comprises a reset signal 14, a first reference voltage signal 16, and a first voltage level signal 18. The sample pulse signal 32 comprises a plurality of square waves 36. Each square wave 36 comprises a positive edge 38 and a negative edge 40, wherein the positive edge 38 of the square wave 36 will set off the sample switch 28 to be a close state, and the negative edge 40 will set off the sample switch 28 to be an open state. The hold pulse signal 34 comprises a plurality of square waves 36. Each square wave 36 comprises a positive edge 38 and a negative edge 40, wherein the positive edge 38 of the square wave 36 will set off the hold switch 30 to be the close state, and the negative edge 40 will set off the hold switch 30 to be the open state.

Please refer to FIG. 2 and FIG. 3. When the first reference voltage signal 16 is inputted to the sample and hold circuit 20, the sample switch 28 and the hold switch 30 are in the close state. Therefore, the voltage value of the first reference voltage signal 16 is sampled to the capacitor 24. When the first voltage level signal 18 is inputted to the sample and hold circuit 20, the sample switch 28 is in the close state while the hold switch 30 is in the open state. As a result, the sample and hold circuit 20 outputs an output signal 42, which is a difference D multiplied by a gain value Gp (not shown). The difference D is a voltage difference between the first reference voltage signal 16 and the first voltage level signal 18. The gain value Gp is calculated by the following equation:

$$Gp = Ca/Cb$$

Wherein Ca is a capacitance value of the capacitor 24, Cb is a capacitance value of the capacitor 26.

However, due to the characteristics variety of electronic parts, the reset signal 14, the first reference voltage signal 16, and the first voltage level signal 18 of the CCD signal 10 all comprise a transition state 44 and a steady state 46. Therefore, only the steady state 46 from the first reference voltage signal 16 and the first voltage level signal 18 may be sampled. The width W of the square wave within the sample pulse signal 32 and the hold pulse signal 34, which enables the sample switch 28 and the hold switch 30 to be at the close state, is usually half of width P of the reference voltage signal 16 or the second voltage level signal 18. The above condition usually causes needing a higher bandwidth of the operational amplifier 22. Hence, choosing a operational amplifier 22 with a higher bandwidth is necessary for sampling and holding the CCD signal 10 accurately.

Besides, the CCD signal 10 is inputted into the operational amplifier 22 within the sample and hold circuit 20 of the prior art via a single end. If the CCD signal 10 is affected by noise, environmental temperature changes, or characteristics variety of electronic parts, an error may occur in the voltage level of the first reference voltage signal 16, thus leading to an error in the output signal 42 outputted by the sample and hold circuit. Furthermore, the sample and hold circuit 20 of the CCD signal 10 of the prior art cannot process or compensate the error.

SUMMARY OF THE INVENTION

The objective of the present invention is to provide an analog front end circuit (AFE circuit) and the operational amplifier with lower bandwidth that can be applied to the AFE circuit of the present invention to lower the cost of production.

The AFE circuit of the present invention is used for converting an analog signal outputted by an image sensor to a digital signal. The analog signal comprises a first voltage level signal and a first reference signal. The AFE circuit comprises a sample and hold circuit and an analog to digital converter device (ADC device). The sample and hold circuit further comprises a variable gain amplifier circuit (VGA circuit), a first sample switch, a second sample switch, and a hold switch. The variable gain amplifier circuit comprises a first input end, a second input end, and at least one output end. The first input end is used for receiving the first voltage level signal; the second input end is used for receiving the first reference signal, and the output end is used for outputting at least one amplified signal. The first sample switch is set in the front end of the first input end. The second sample switch is set in the front end of the second input end. The hold switch is connected between the first input end and the second input end.

While the first sample switch is at a first conductive state (on), the first input end receives the first voltage level signal; while the second sample switch is at the first conductive state (on), the second input end receives the first reference signal, and while the hold switch is at a second conductive state (on), the output end outputs the amplified signal.

The ADC device is used for receiving the amplified signal and converting the amplified signal into the digital signal.

Compared with the prior art, the sample and hold circuit of the present invention uses differential input, and the required bandwidth of the VGA circuit is lower than the prior art. Therefore, the sample and hold circuit of the present invention may utilize an operational amplifier with a lower bandwidth. Furthermore, the sample and hold circuit of the present invention can adjust the first reference signal by adjusting the control signal to process or compensate any error generated due to noise, environmental temperature changes, or characteristics variety of electronic parts.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 4:
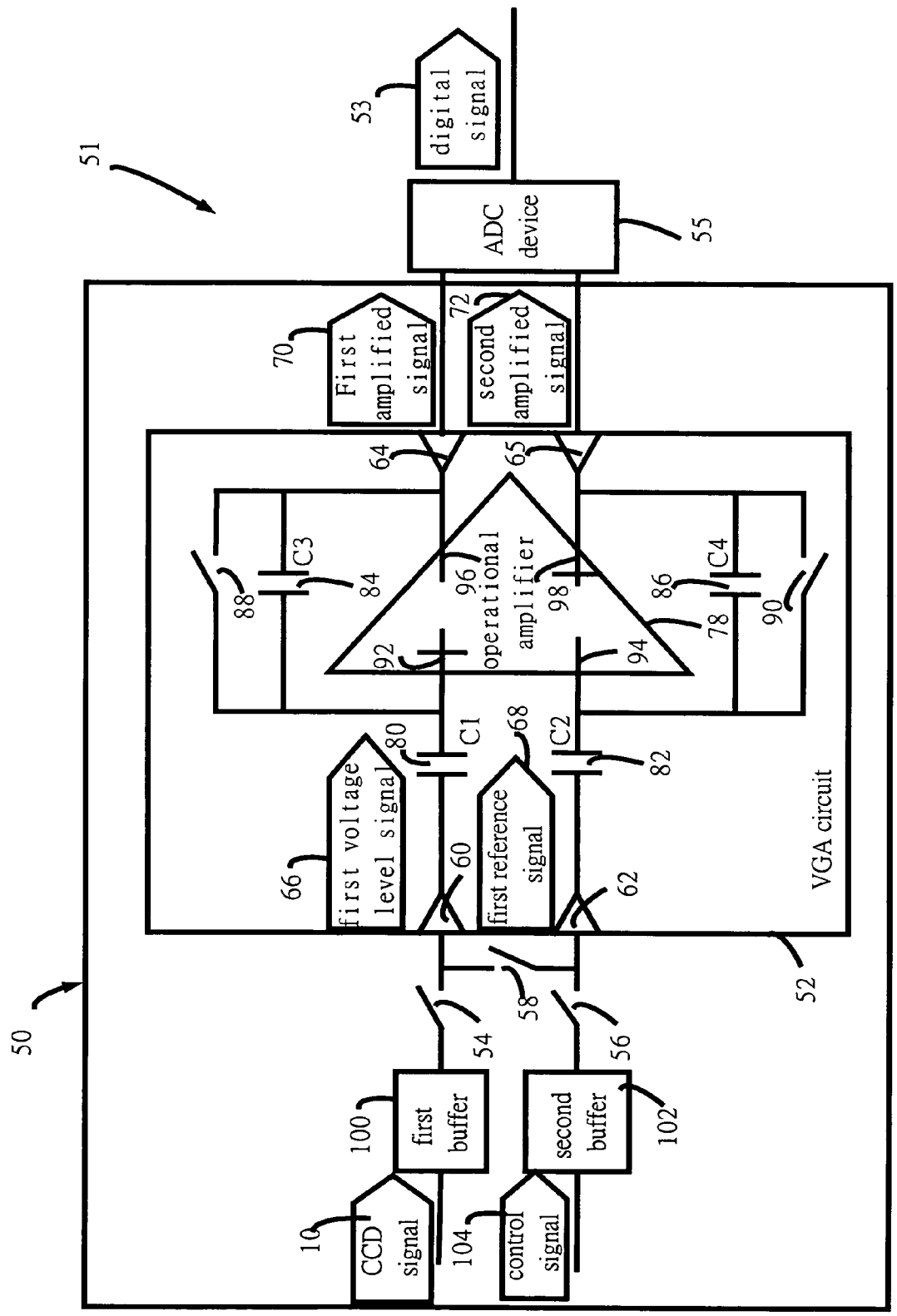
FIG. 4 is a schematic diagram of an AFE circuit of the present invention.
Figure 5:
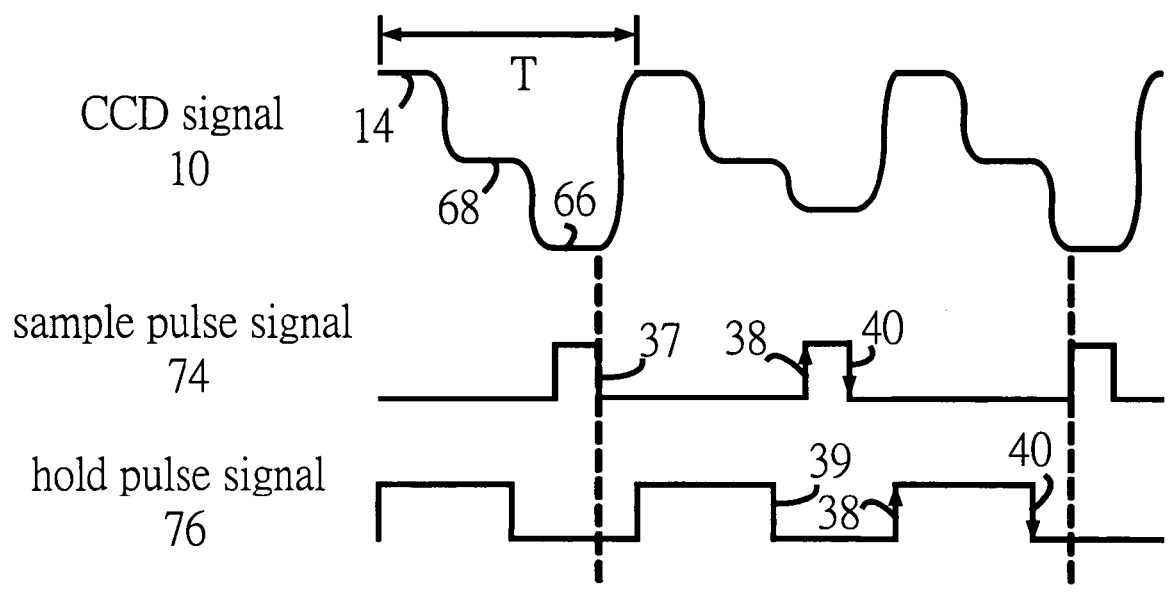
FIG. 5 is a time sequence diagram of the CCD signal, the sample pulse signal, and the hold pulse signal of the present invention.

Please refer to FIG. 4 and FIG. 5. FIG. 4 is a schematic diagram of an AFE circuit 51 of the present invention. FIG. 5 is a time sequence diagram of the CCD signal 10, the sample pulse signal 74, and the hold pulse signal 76 of the present invention. In the time sequence diagram of FIG. 5, the horizontal axis represents time, and the vertical axis represents amplitude of signal. The AFE circuit 51 converts a CCD signal 10 outputted by the CCD to a digital signal 53. The CCD signal 10 is an analog signal and comprises a first voltage level signal and a first reference signal. The AFE circuit 51 comprises a sample and hold circuit 50 and an ADC device 55. The sample and hold circuit 50 is used for sampling and holding the CCD signal 10 and outputting a set of amplified signals 70, 72. The ADC device 55 is used for receiving the amplified signals 70, 72 and converting the amplified signals 70, 72 into the digital signal 53, wherein the CCD signal 10 is an analog signal with period T. The CCD signal 10 of each cycle comprises a reset signal 14, a reference voltage signal (not shown), and a second voltage level signal (not shown).

The sample and hold circuit 50 comprises a first buffer 100, a second buffer 102, a VGA circuit 52, a first sample switch 54, a second sample switch 56, and a hold switch 58. The first buffer 100 is used for receiving the CCD signal 10 and shifting the reference voltage signal of the CCD signal 10 to a first reference signal 68 and the second voltage level signal of the CCD signal 10 to a first voltage level signal 66, so as to be inputted to the VGA circuit 52. The second buffer 102 is used for receiving a control signal 104 to generate a first reference signal 68.

The VGA circuit 52 comprises a first input end 60, a second input end 62, and a set of output ends 64, 65. The first input end 60 is used for receiving the first voltage level signal 66. The second input end 62 is used for receiving the first reference signal 68. The output ends 64, 65 are used for outputting the amplified signals 70, 72.

The first sample switch 54 is set in the front end of the first input end 60; the second sample switch 56 is set in the front end of the second input end 62, and the hold switch 58 is connected between the first input end 60 and the second input end 62. While the first sample switch 54 is at a first conductive state (i.e. the close state, not shown), the first input end 60 receives the first voltage level signal 66; while the second sample switch 56 is at the first conductive state (i.e. the close state), the second input end 62 receives the first reference signal 68, and while the hold switch 58 is at a second conductive state (i.e. the close state, not shown), the output end 64, 65 outputs the amplified signals 70, 72. The ADC device 55 is used for receiving the amplified signals 70, 72 and converting the amplified signals 70, 72 into the digital signal 53.

The VGA circuit 52 further comprises a operational amplifier 78, a first capacitor 80, a second capacitor 82, a third capacitor 84, a fourth capacitor 86, a third sample switch 88, and a fourth sample switch 90.

The operational amplifier 78 comprises a first differential input end 92, a second differential input end 94, a first differential output end 96, and a second differential output end 98.

The first capacitor 80 is connected to the first input end 60 and the first differential input end 92, wherein the capacitance value of the first capacitor 80 is C1. The second capacitor 82 is connected to the second input end 62 and the second differential input end 94, wherein the capacitance value of the second capacitor 82 is C2. The third capacitor 84 and the third sample switch 88 are individually connected to the first differential input end 92 and the first differential output end 96, wherein the capacitance value of the third capacitor 84 is C3. The fourth capacitor 86 and the fourth sample switch 90 are individually connected to the second differential input end 94 and the second differential output end 98, wherein the capacitance value of the fourth capacitor 86 is C4.

Please refer to FIG. 4 and FIG. 5. The first sample switch 54, the second sample switch 56, the third sample switch 88, and the fourth sample switch 90 are controlled by a sample pulse signal 74. The sample pulse signal 74 comprises a plurality of square waves 37. Each square wave 37 comprises a positive edge 38 and a negative edge 40. Wherein the positive edge 38 of the square wave 37 sets off the first sample switch 54, the second sample switch 56, the third sample switch 88, and the fourth sample switch 90 to be at the first conductive state (i.e. the close state), the negative edge 40 sets off the first sample switch 54, the second sample switch 56, the third sample switch 88, and the fourth sample switch 90 to be at the nonconductive state (i.e. the open state).

The hold switch 58 is controlled by a hold pulse signal 76. The hold pulse signal 76 comprises a plurality of square waves 39. Each square wave 39 comprises a positive edge 38 and a negative edge 40. Wherein the positive edge 38 of the square wave 39 sets off the hold switch 58 to be at the second conductive state (i.e. the close state), the negative edge 40 sets off the hold switch 58 to be at the nonconductive state (i.e. the open state).

Please refer to FIG. 4 and FIG. 5. When the first voltage level signal 66 is inputted to the sample and hold circuit 50, the first sample switch 54, the second sample switch 56, the third sample switch 88, and the fourth sample switch 90 are controlled by the sample pulse signal 74 to be at the first conductive state (i.e. the close state). Therefore, the voltage value of the first voltage level signal 66 is sampled to the first capacitor 80, and the voltage value of the first reference signal 68 is sampled to the second capacitor 82. When the reset signal 14 and the first reference signal 68 of the CCD signal 10 are inputted to the sample and hold circuit 50, the hold switch 58 is controlled by the hold pulse signal 76 to be at the second conductive state (i.e. the close state). Therefore, the output ends 64, 65 output the amplified signals 70, 72.

Furthermore, the amplified signals 70, 72 within this embodiment represent a first amplified signal 70 and a second amplified signal 72. The difference between the first amplified signal 70 and the second amplified signal 72 is the product of the difference between the first voltage level signal 66 and the first reference signal 68 multiplying a gain value G of the VGA circuit 52. The gain value G is calculated by the following equation:

$$G=C1/C3; (C1:C3=C2:C4)$$

In this embodiment, the output end 64 is connected to the first differential output end 96. The first differential output end 96 is used for outputting the first amplified signal 70. The output end 65 is connected to the second differential output end 98. The second differential output end 98 is used for outputting the second amplified signal 72.

Figure 6A:
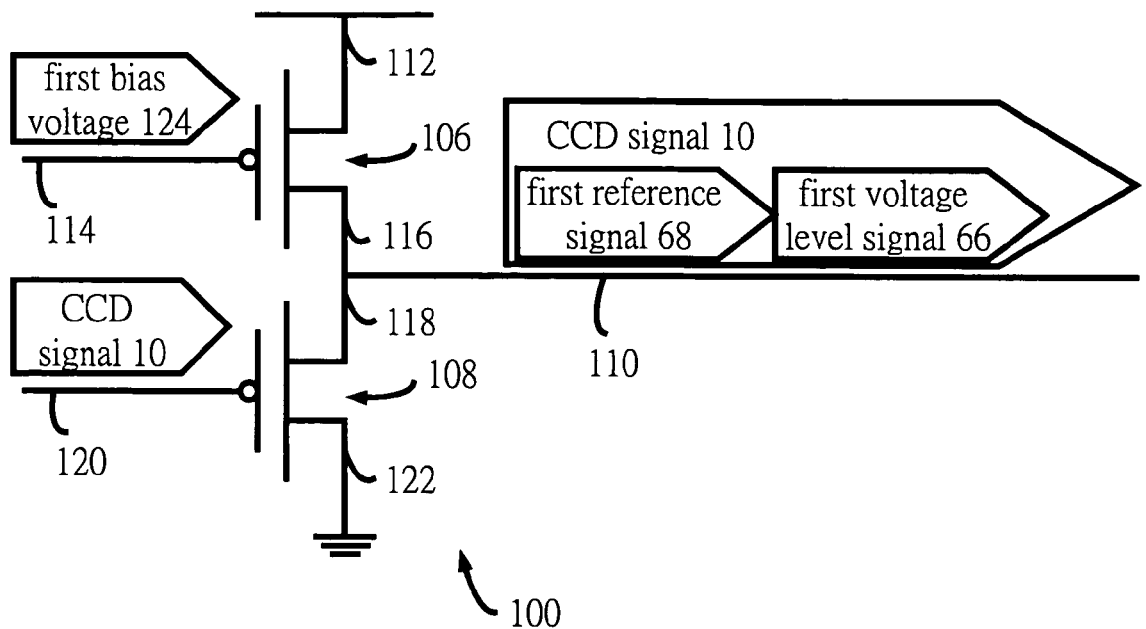
FIG. 6A is a schematic diagram of the first buffer shown in FIG. 4.

Besides, please refer to FIG. 6A. FIG. 6A is a schematic diagram of the first buffer 100 shown in FIG. 4. The first buffer 100 comprises a first P channel metal oxide semiconductor (PMOS) 106, a second PMOS 108, and an output end 110 of the first buffer. The first PMOS 106 has a first source 112, a first gate 114, and a first drain 116. The second PMOS 108 has a second source 118, a second gate 120, and a second drain 122. Wherein the first source 112 is connected to a power supply, the second drain 122 is grounded; a first bias voltage 124 is inputted to the first gate 114, and the first drain 116 and the second source 118 are both connected to the output end 110 of the first buffer. The CCD signal 10 is inputted from the second gate 120 to the first buffer 100 and converted by the output end 110 of the first buffer to output the CCD signal 10, comprising the first reference signal 68 and the first voltage level signal 66.

Figure 6B:
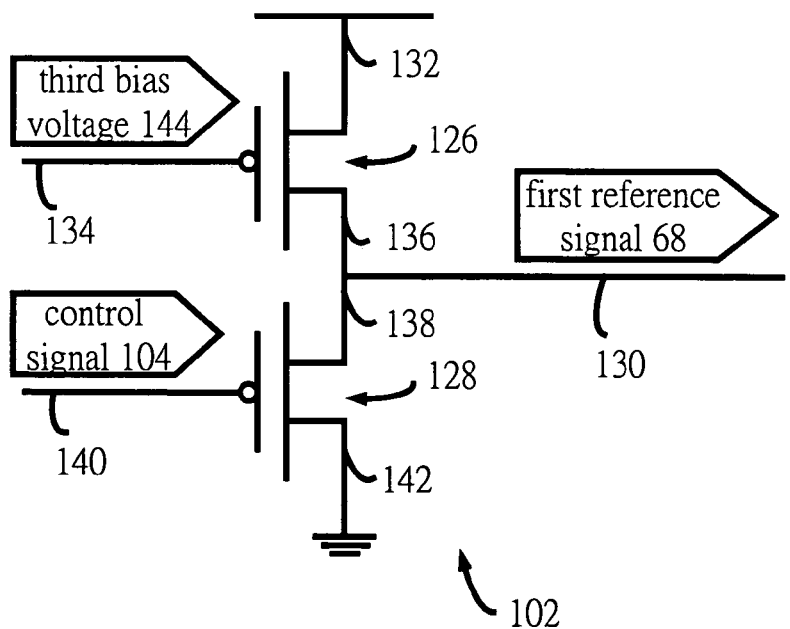
FIG. 6B is a schematic diagram of the second buffer shown in FIG. 4.

Please refer to FIG. 6B. FIG. 6B is a schematic diagram of the second buffer 102 shown in FIG. 4. The second buffer 102 comprises a third PMOS 126, a fourth PMOS 128, and an output end 130 of the second buffer. The third PMOS 126 has a third source 132, a third gate 134, and a third drain 136. The fourth PMOS 128 has a fourth source 138, a fourth gate 140, and a fourth drain 142. Wherein the third source 132 is connected to a power supply, the fourth drain 142 is grounded; a third bias voltage 144 is inputted to the third gate 134, and the third drain 136 and the fourth source 138 are both connected to the output end 130 of the second buffer. The control signal 104 is inputted from the fourth gate 140 to the second buffer 102 and converted by the output end 130 of the second buffer to output the first reference signal 68.

Figure 1:
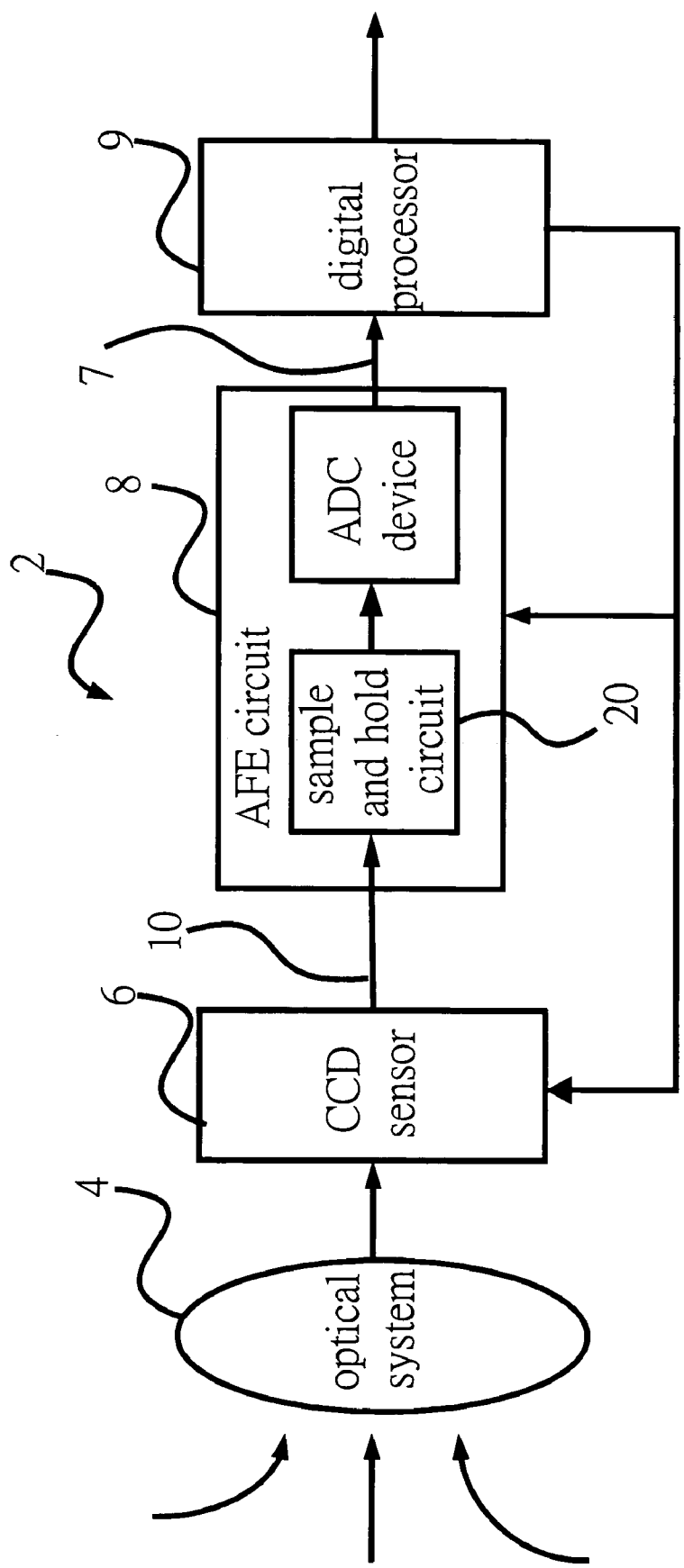
FIG. 1 is a schematic diagram of an image capture device of the prior art.
Figure 2:
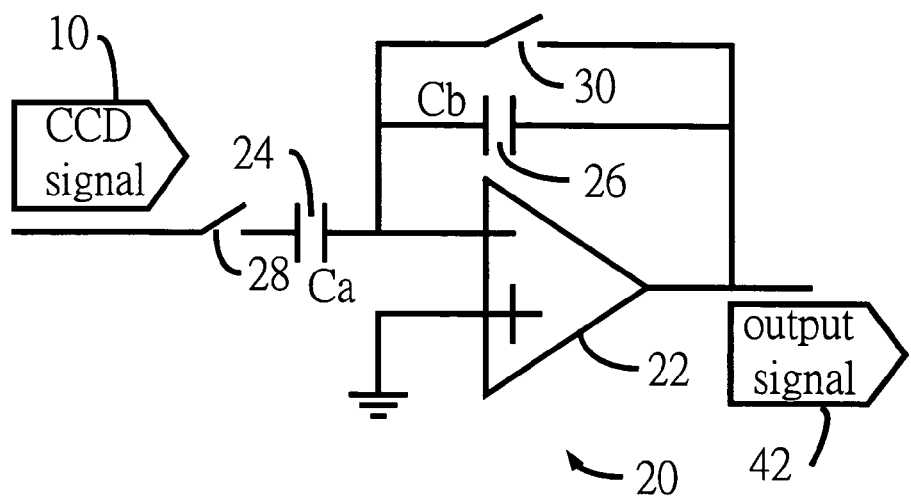
FIG. 2 is a schematic diagram of a sample and hold circuit of the AFE circuit of the prior art.
Figure 3:
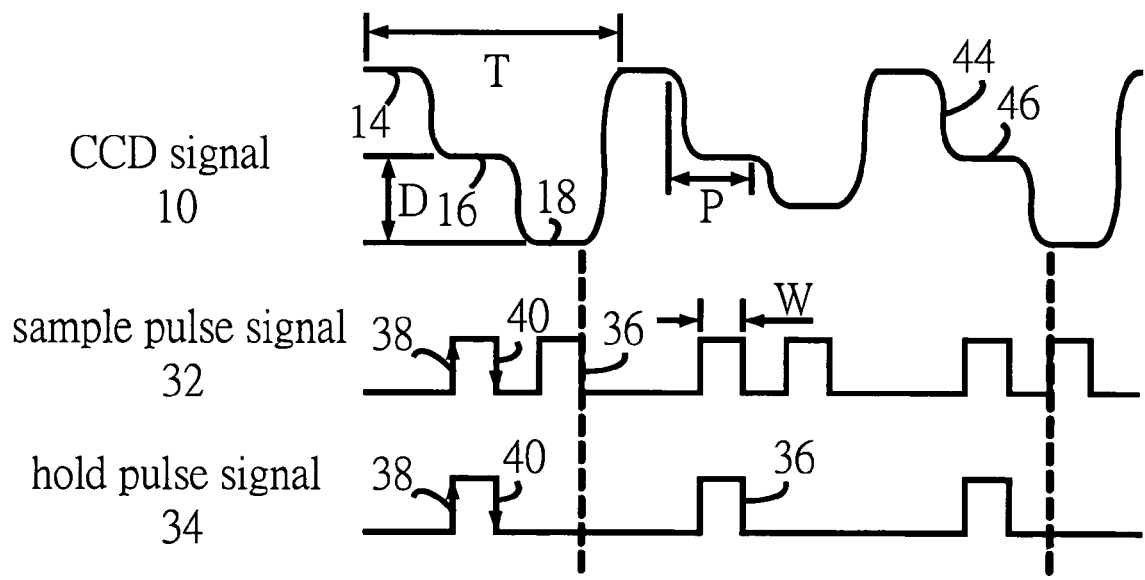
FIG. 3 is a time sequence diagram of the CCD signal, the sample pulse signal, and the hold pulse signal of the prior art.

Please refer to FIG. 3 and FIG. 5. Compared to the prior art, in the AFE circuit 51 of the present invention, the width of the hold pulse signal 76 is larger than the width of the hold pulse signal 34 of the prior art. In another words, the operational amplifier has longer settling time. Therefore, the AFE circuit 51 of the present invention may utilize an operational amplifier 22 with lower bandwidth.

Besides, compared to the AFE circuit 8 of the prior art, the AFE circuit 51 of the present invention processes the first voltage level signal 66 and the first reference signal 68 of the CCD signal 10 by a differential manner to complete the function of correlated double sampling (CDS). It is different from the AFE circuit 8 of the prior art which complete the function of correlated double sampling (CDS) in a series manner.

Furthermore, the operational amplifier 22 within the sample and hold circuit 20 of the AFE circuit 8 of the prior art is a one-way input; its first reference voltage signal 16 is comprised in the CCD signal 10. If the CCD signal 10 is affected by noise, environmental temperature changes, or characteristics variety of electronic parts, causing the voltage level of the first reference voltage signal 16 to have an error, another error may also occur in the difference of voltage D outputted by the sample and hold circuit 20. The first reference signal 68 of the AFE circuit 51 of the present invention is generated by the control signal 104 received by the second buffer 102. The second buffer 102 is controlled by the control signal 104 to output the corresponding first reference signal 68. Therefore, compared to the prior art, the AFE circuit 51 of the present invention can overcome the problem of voltage level error caused by the first reference voltage signal 16.

Figure 7:
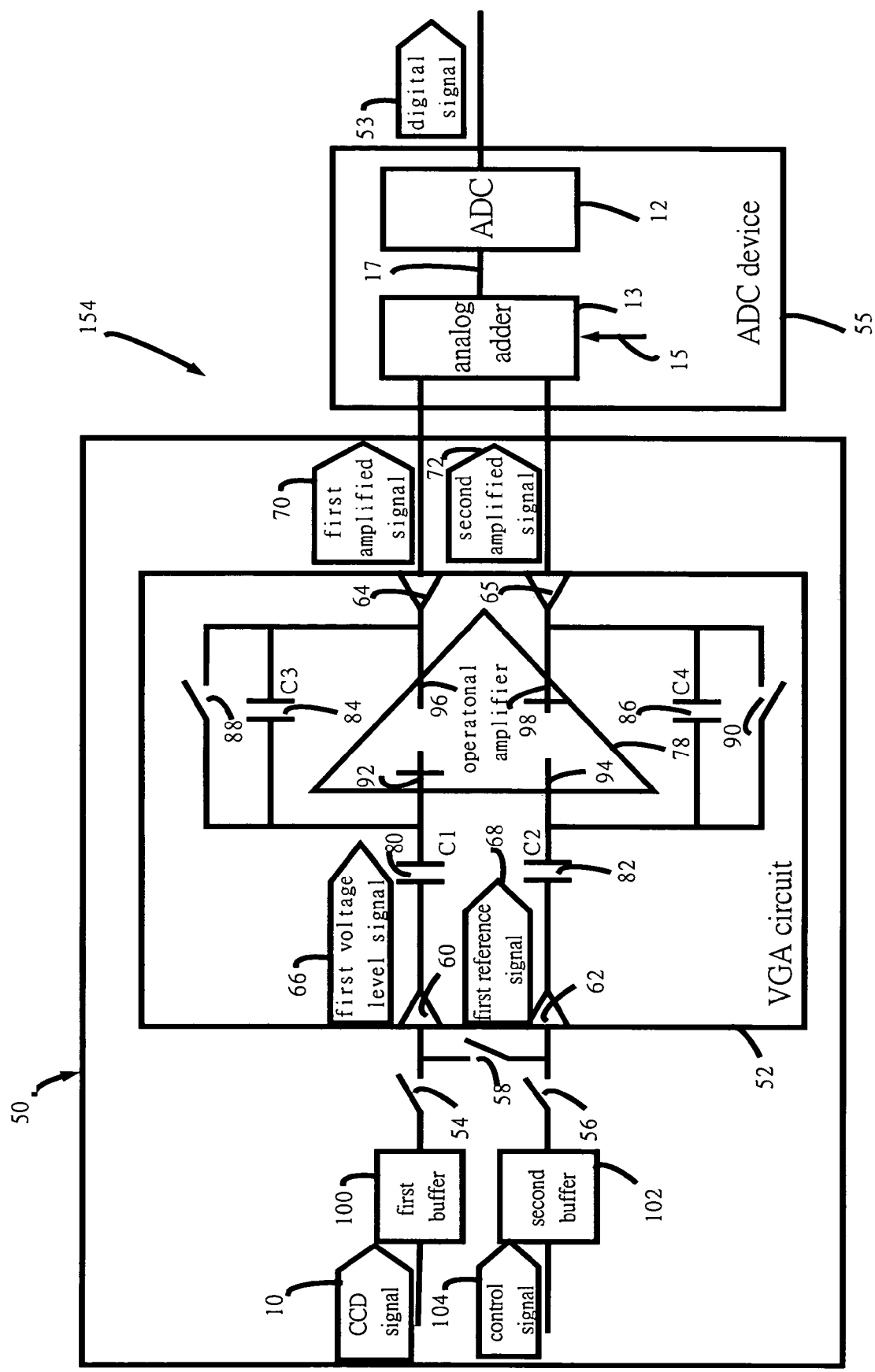
FIG. 7 is a schematic diagram of an AFE circuit of another preferred embodiment according to the present invention.

Please refer to FIG. 7. FIG. 7 is a schematic diagram of an AFE circuit 154 of another preferred embodiment according to the present invention. The biggest difference of this circuit from the AFE circuit 51 in FIG. 4 is that the ADC device 55 further comprises an analog adder 13 and an analog to digital converter (ADC) 12, wherein the analog adder 13 is used for adding a DC signal 15 and the amplified signals 70, 72 (both are differential signals) to output a converted voltage signal 17. The ADC 12 is used for receiving the converted voltage signal 17 and converting the converted voltage signal 17 into the digital signal 53. By the analog adder 13, the amplified signals 70, 72 can be adjusted into two-way differential manner, and the input range of the ADC 12 may be utilized effectively. Generally speaking, the ADC is suitable for inputting signals within the range of +vref~−vref (vref is a value of voltage, e.g. vref=0.5V). If the range of signals is not adjusted, only the partial input range of the ADC may be utilized. For example, if the value of differential signal outputted by the CCD is 0~0.5V, it becomes 0~1V via the VGA circuit 52, and if the ADC 12 is suitable for inputting the range of 0.5V~−0.5V, the ADC 12 cannot process the signals. However, if the value of differential signals becomes 0.5V~−0.5V by adding the DC signal 15 (−0.5V) via an analog adder 13, the differential signals can then completely conform to the input range of the ADC device.

Compared to the prior art, in the AFE circuit 154 of the present invention, the width of the hold pulse signal 76 is larger than the width of the hold pulse signal 34 of the prior art. In other words, the operational amplifier has longer settling time. Therefore, the AFE circuit 154 of the present invention may utilize the operational amplifier 22 with lower bandwidth.

Besides, compared to the AFE circuit 8 of the prior art, the AFE circuit 154 of the present invention processes the first voltage level signal 66 and the first reference signal 68 of the CCD signal 10 by a differential manner, thus completing the function of correlated double sampling (CDS). This is different from the AFE circuit 8 of the prior art which complete the function of correlated double sampling (CDS) in a series manner.

Furthermore, the CCD signal 10 is inputted into the operational amplifier 22 within the sample and hold circuit 20 of the AFE circuit 8 of the prior art via a single end, and its first reference voltage signal 16 is comprised in the CCD signal 10. If the CCD signal 10 is affected by noise, environmental temperature changes, or characteristics variety of electronic parts, causing the voltage level of the first reference voltage signal 16 to have an error, another error may also occur in the difference of voltage D outputted by the sample and hold circuit 20. The first reference signal 68 of the AFE circuit 154 of the present invention is generated by the control signal 104 received by the second buffer 102. The second buffer 102 is controlled by the control signal 104 to output the corresponding first reference signal 68. Therefore, compared to the prior art, the AFE circuit 154 of the present invention can overcome the problem of voltage level error caused by the first reference voltage signal 16.

Figure 8:
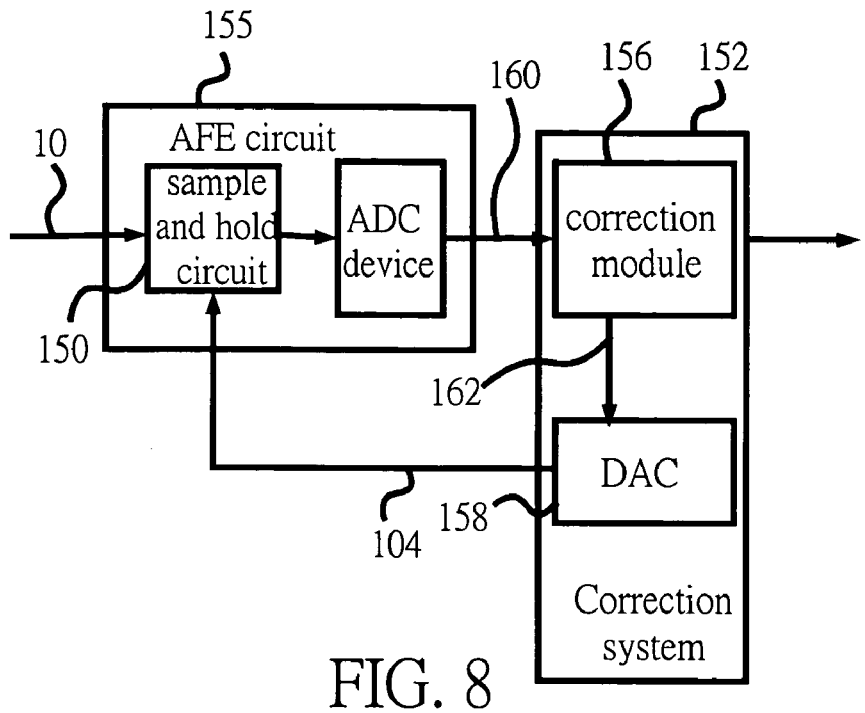
FIG. 8 is a schematic diagram of an AFE circuit of another preferred embodiment according to the present invention.

Please refer to FIG. 8. FIG. 8 is a schematic diagram of an AFE circuit 155 of another preferred embodiment according to the present invention. The biggest difference from the AFE circuit 51 in FIG. 4 is that the control signal 104 thereof is generated by a correction system 152. The correction system 152 comprises a correction module 156 and a digital to analog converter (DAC) 158, wherein the correction module 156 generates a digital correction signal 162 according to the difference between the output signal 160 of the AFE circuit 154 and a predetermined value (not shown in FIG. 7). The DAC 158 converts the digital correction signal 162 into the control signal 104 and inputs the control signal 104 to the second buffer 102 to generate the corresponding first reference signal 69.

Furthermore, the CCD signal 10 is inputted into the operational amplifier 22 within the sample and hold circuit 20 of the AFE circuit 8 of the prior art via a single end, and its first reference voltage signal 16 is comprised in the CCD signal 10. If the CCD signal 10 is affected by noise, environmental temperature changes, or characteristics variety of electronic parts, causing the voltage level of the first reference voltage signal 16 to have an error, another error may also occur in the difference of voltage D outputted by the sample and hold circuit 20. The first reference signal 68 of the AFE circuit 155 of the present invention is generated by the control signal 104 received by the second buffer 102. The second buffer 102 is controlled by the control signal 104 to output the corresponding first reference signal 68. Therefore, compared to the prior art, the AFE circuit 155 of the present invention can overcome the problem of voltage level error caused by the first reference voltage signal 16.

Therefore, the operational amplifier 78 of the AFE circuit 155 of the present invention uses differential input and can adjust the first reference signal 68 by adjusting the control signal 104 to process or compensate the error generated by the influence of noise, environmental temperature changes, or characteristics variety of electronic parts.

Figure 9:
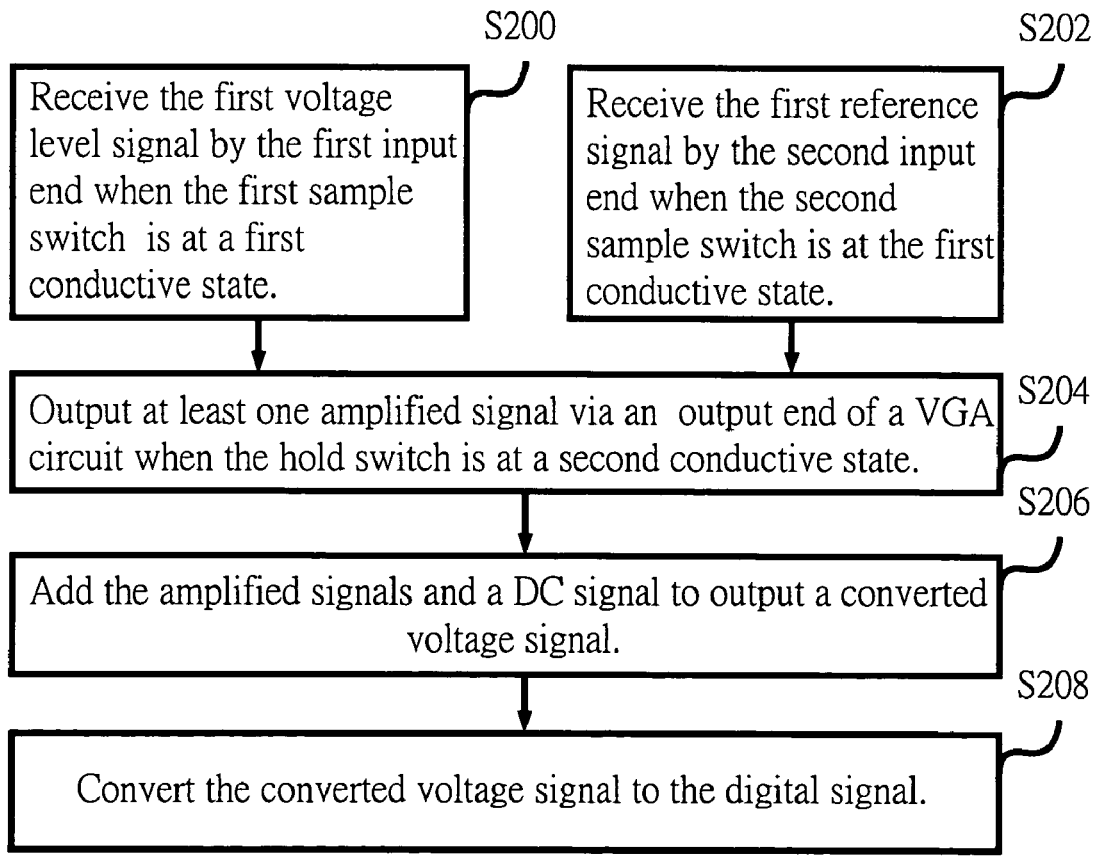
FIG. 9 is a schematic diagram of an AFE signal process method of the present invention.

Please refer to FIG. 9. FIG. 9 is a schematic diagram of an AFE signal process method of the present invention. Taking the AFE circuit 154 in FIG. 7 as an example, the AFE signal process method comprises the following steps:

S200: Receive the first voltage level signal 66 by the first input end 60 when the first sample switch 54 in the front end of the first input end 60 is set at a first conductive state (i.e. the close state).

S202: Receive the first reference signal 68 by the second input end 62 when the second sample switch 56 in the front end of the second input end 62 is set at the first conductive state (i.e. the close state).

S204: Output a set of amplified signals 70, 72 via a set of output ends 64, 65 of the VGA circuit 52 when the hold switch 58, connected between the first input end 60 and the second input end 62, is at a second conductive state (i.e. the close state).

S206: Add the amplified signals 70, 72 and a DC signal 15 to output a converted voltage signal 17.

S208: Convert the converted voltage signal 17 into the digital signal 53.

Compared to the prior art, in the AFE signal process method of the present invention, the width of the hold pulse signal 76 is larger than the width of the hold pulse signal 34 of the prior art. In other words, the operational amplifier has longer settling time. Therefore, the AFE signal process method of the present invention may utilize the operational amplifier 22 with lower bandwidth.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An analog front end circuit converting an analog signal outputted by an image sensor into a digital signal, the analog signal comprising a first voltage level signal and a first reference signal, the analog front end circuit comprising:
   a sample and hold circuit comprising:
   a variable gain amplifier circuit comprising a first input end, a second input end, and at least one output end, the first input end being used for receiving the first voltage level signal, the second input end being used for receiving the first reference signal, the output end being used for outputting at least an amplified signal,
   a first sample switch in the front end of the first input end,
   a second sample switch in the front end of the second input end, and
   a hold switch connected between the first input end and the second input end,
   wherein the first sample switch and the second sample switch are both controlled by a sample pulse signal,
   wherein while the first sample switch is at a first conductive state, the first input end receives the first voltage level signal, while the second sample switch is at the first conductive state, the second input end receives the first reference signal, and while the hold switch is at a second conductive state, the output end outputs the amplified signal; and
   an analog to digital converter device for receiving the amplified signal and converting the amplified signal into the digital signal.

2. The analog front end circuit of claim 1, wherein the hold switch is controlled by a hold pulse signal.

3. The analog front end circuit of claim 1, wherein the sample and hold circuits further comprise a first buffer for receiving a charged-coupled device signal and shifting a second voltage level signal of the charged-coupled device signal to the first voltage level signal.

4. The analog front end circuit of claim 3, wherein the first buffer comprises:
   a first P channel metal oxide semiconductor having a first source, a first gate, and a first drain;
   a second P channel metal oxide semiconductor having a second source, a second gate, and a second drain; and
   an output end of the first buffer;

wherein the first source is connected to a power supply, the second drain is grounded, a first bias voltage is inputted to the first gate, the charged-coupled device signal is inputted to the second gate, and the first drain and the second source are both connected to the output end of the first buffer.

5. The analog front end circuit of claim 1, wherein the sample and hold circuit further comprises a second buffer for receiving a control signal to generate the first reference signal.

6. The analog front end circuit of claim 5, wherein the second buffer comprises:
a third P channel metal oxide semiconductor having a third source, a third gate, and a third drain;
a fourth P channel metal oxide semiconductor having a fourth source, a fourth gate, and a fourth drain; and
an output end of the second buffer;
wherein the third source is connected to the power supply, the fourth drain is grounded, a third bias voltage is inputted to the third gate, the first reference signal is inputted to the fourth gate, and the third drain and the fourth source are both connected to the output end of the second buffer.

7. The analog front end circuit of claim 1, wherein the variable gain amplifier circuit further comprises:
an operational amplifier comprising a first differential input end, a second differential input end, a first differential output end, and a second differential output end;
a first capacitor connected to the first input end and the first differential input end, wherein the capacitance value of the first capacitor is $C1$;
a second capacitor connected to the second input end and the second differential input end, wherein the capacitance value of the second capacitor is $C2$;
a third capacitor and a third sample switch, individually connected to the first differential input end and the first differential output end, wherein the capacitance value of the third capacitor is $C3$; and
a fourth capacitor and a fourth sample switch, individually connected to the second differential input end and the second differential output end, wherein the capacitance value of the fourth capacitor is $C4$.

8. The analog front end circuit of claim 7, wherein the amplified signal comprises a first amplified signal and a second amplified signal, the difference between the first amplified signal and the second amplified signal is the product of the difference between the first voltage level signal and the first reference signal and a gain value of the variable gain amplifier circuit, and the gain value is calculated by the following equation:

$$G=C1/C3; C1:C3=C2:C4.$$

9. The analog front end circuit of claim 8, wherein the output end comprises the first differential output end and the second differential output end, the first differential output end is used for outputting the first amplified signal, and the second differential output end is used for outputting the second amplified signal.

10. The analog front end circuit of claim 1, wherein the analog to digital converter device further comprises:
an analog adder for receiving a DC signal and the amplified signal to output a converted voltage signal; and
an analog to digital converter for receiving the converted voltage signal and converting the converted voltage signal into the digital signal.

11. An analog front end signal process method converting an analog signal outputted by an image sensor to a digital signal, the analog signal comprising a first voltage level signal and a first reference signal, the method comprising the following steps:
(a) receiving the first voltage level signal by a first input end of a variable gain amplifier circuit when a first sample switch in the front end of the first input end is set at a first conductive state;
(b) receiving the first reference signal by a second input end of the variable gain amplifier circuit when a second sample switch in the front end of the second input end is set at the first conductive state;
(c) outputting at least one amplified signal via an output end of the variable gain amplifier circuit when a hold switch connected between the first input end and the second input end is at a second conductive state; and
(d) converting the amplified signal into the digital signals, wherein the first sample switch and the second sample switch are both controlled by a sample pulse signal.

12. The method of claim 11, wherein the hold switch is controlled by a hold pulse signal.

13. The method of claim 11, wherein the first voltage level signal is generated by a first buffer, and the first buffer is used for receiving a charged-coupled device signal and shifting a second voltage level signal of the charged-coupled device signal to the first voltage level signal.

14. The method of claim 13, wherein the first buffer comprises:
a first P channel metal oxide semiconductor having a first source, a first gate, and a first drain;
a second P channel metal oxide semiconductor having a second source, a second gate, and a second drain; and
an output end of the first buffer;
wherein the first source is connected to a power supply, the second drain is grounded, a first bias voltage is inputted to the first gate, the charged-coupled device signal is inputted to the second gate, and the first drain and the second source are both connected to the output end of the first buffer.

15. The method of claim 11, wherein the first reference signal is generated by a second buffer, and the second buffer is used for receiving a control signal to generate the first reference signal.

16. The method of claim 15, wherein the second buffer comprises:
a third P channel metal oxide semiconductor having a third source, a third gate, and a third drain;
a fourth P channel metal oxide semiconductor having a fourth source, a fourth gate, and a fourth drain; and
an output end of the second buffer;
wherein the third source is connected to the power supply, the fourth drain is grounded, a third bias voltage is inputted to the third gate, the first reference signal is inputted to the fourth gate, and the third drain and the fourth source are both connected to the output end of the second buffer.

17. The method of claim 11, wherein the variable gain amplifier circuit further comprises:
an operational amplifier comprising a first differential input end, a second differential input end, a first differential output end, and a second differential output end;
a first capacitor connected to the first input end and the first differential input end, wherein the capacitance value of the first capacitor is $C1$;
a second capacitor connected to the second input end and the second differential input end, wherein the capacitance value of the second capacitor is $C2$;

a third capacitor and a third sample switch, individually connected to the first differential input end and the first differential output end, wherein the capacitance value of the third capacitor is C3; and a fourth capacitor and a fourth sample switch, individually connected to the second differential input end and the second differential output end, wherein the capacitance value of the fourth capacitor is C4.

18. The method of claim 17, wherein the amplified signal comprises a first amplified signal and a second amplified signal, the difference between the first amplified signal and the second amplified signal is the product of the difference between the first voltage level signal and the first reference signal and a gain value of the variable gain amplifier circuit, and the gain value is calculated by the following equation:

$$G=C1/C3; C1:C3=C2:C4.$$

19. The method of claim 18, wherein the output end comprises the first differential output end and the second differential output end, the first differential output end is used for outputting the first amplified signal, and the second differential output end is used for outputting the second amplified signal.

20. The method of claim 11, wherein the step (d) further comprises the following steps:

(d1) adding the amplified signal and a DC signal to output a converted voltage signal; and (d2) converting the converted voltage signal into the digital signal.

* * * * *